US011133389B2

(12) United States Patent
Clark et al.

(10) Patent No.: US 11,133,389 B2
(45) Date of Patent: Sep. 28, 2021

(54) PNICTIDE NANOCOMPOSITE STRUCTURE FOR LATTICE STABILIZATION

(71) Applicant: IQE plc, Cardiff (GB)

(72) Inventors: Andrew Clark, Mountain View, CA (US); Rodney Pelzel, Emmaus, PA (US); Mukul Debnath, Stokesdale, NC (US); Rytis Dargis, Oak Ridge, NC (US); Robert Yanka, Kernersville, NC (US)

(73) Assignee: IQE plc, Cardiff (GB)

( * ) Notice: Subject to any disclaimer, the term of this patent is extended or adjusted under 35 U.S.C. 154(b) by 0 days.

(21) Appl. No.: 16/782,296

(22) Filed: Feb. 5, 2020

(65) Prior Publication Data

US 2020/0266276 A1 Aug. 20, 2020

Related U.S. Application Data

(60) Provisional application No. 62/806,378, filed on Feb. 15, 2019.

(51) Int. Cl.
 *H01L 29/205* (2006.01)
(52) U.S. Cl.
 CPC ................ *H01L 29/205* (2013.01)
(58) Field of Classification Search
 CPC ............. Y10S 977/778; Y10S 148/097; H01L 29/205; H01L 21/02507; H01L 21/02543
 See application file for complete search history.

(56) References Cited

U.S. PATENT DOCUMENTS

| 9,136,456 | B2 | 9/2015 | Zide et al. |
| 2008/0001127 | A1* | 1/2008 | Zide ........................ H01L 35/18 |
| | | | 252/521.1 |
| 2016/0240707 | A1 | 8/2016 | Preu et al. |

OTHER PUBLICATIONS

Driscoll et al., "Ultrafast photoresponse at 1.55 μm in InGaAs with embedded semimetallic ErAs nanoparticles," Applied Physics Letters, 86: (5) 51908-1-51908-03 (2005).
Kadow et al., "Self-assembled ErAs islands in GaAs: Growth and subpicosecond carrier dynamics," Applied Physics Letters, 75: (22) 3548-3550 (1999).
Singer et al., "Self-organizing growth of erbium arsenide Quantum dots and wires in gallium arsenide by molecular beam epitaxy," Applied Physics Letters, 64: (6) 707-709 (1994).
Bei Shi et al., "Self-organized InAs/InAlGaAs quantum dots as dislocation filters for InP films on (001) Si," Journal of Crystal Growth (2017).
L. Cassels et al., "Growth and characterization of TbAs:GaAs nanocomposite," J Vac Sci & Tech B, v29, p. 03c114-1 (2011).
Young et al., "Lattice distortion in a single crystal rare-earth arsenide / GaAs nanocomposite," A.J. APL v104, p. 073114 (2014).

* cited by examiner

*Primary Examiner* — Fernando L Toledo
*Assistant Examiner* — Valerie N Newton
(74) *Attorney, Agent, or Firm* — Sterne, Kessler, Goldstein & Fox P.L.L.C.

(57) ABSTRACT

A layered structure for semiconductor application is described herein. The layered structure includes III-V semiconductor and uses pnictide nanocomposites to control lattice distortion in a series of layers. The distortion is tuned to bridge lattice mismatch between binary III-V semiconductors. In some embodiments, the layered structure further includes dislocation filters.

18 Claims, 14 Drawing Sheets

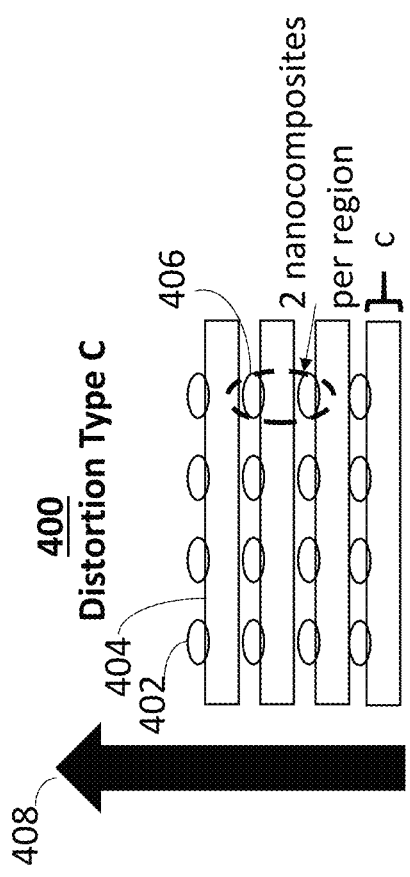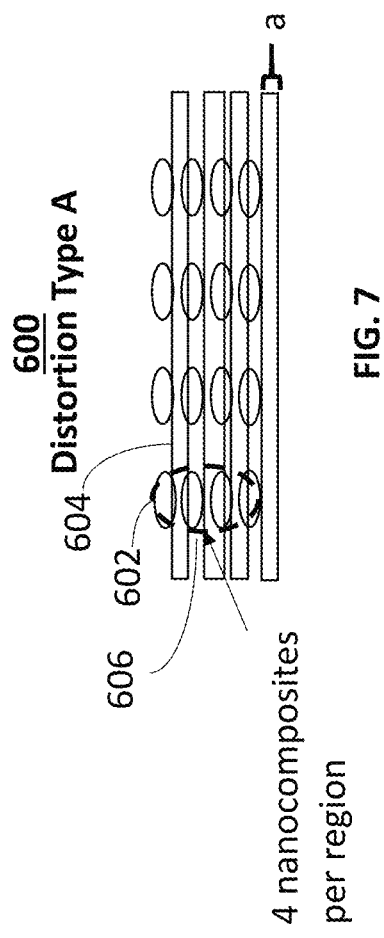

Distortion Type A

Distortion Type B

Distortion Type C

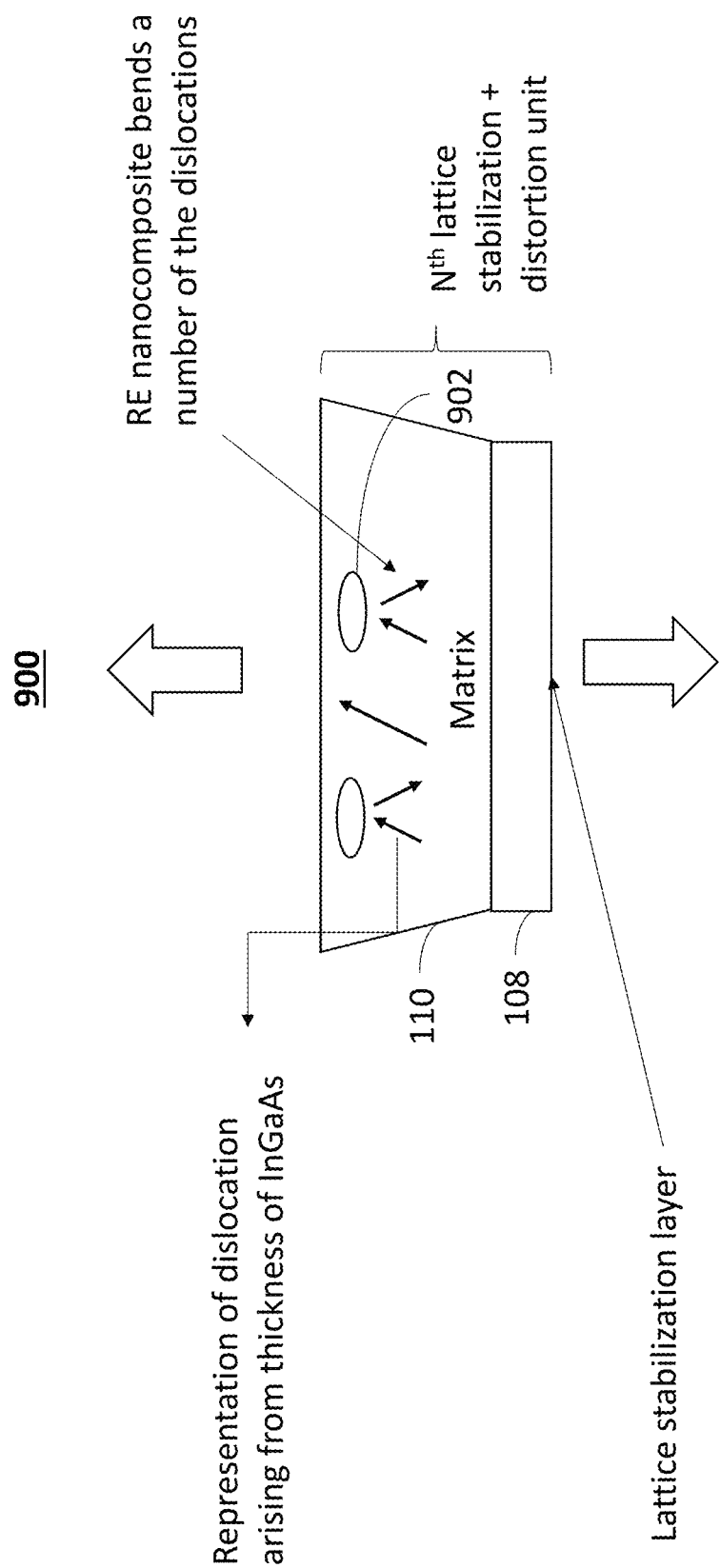

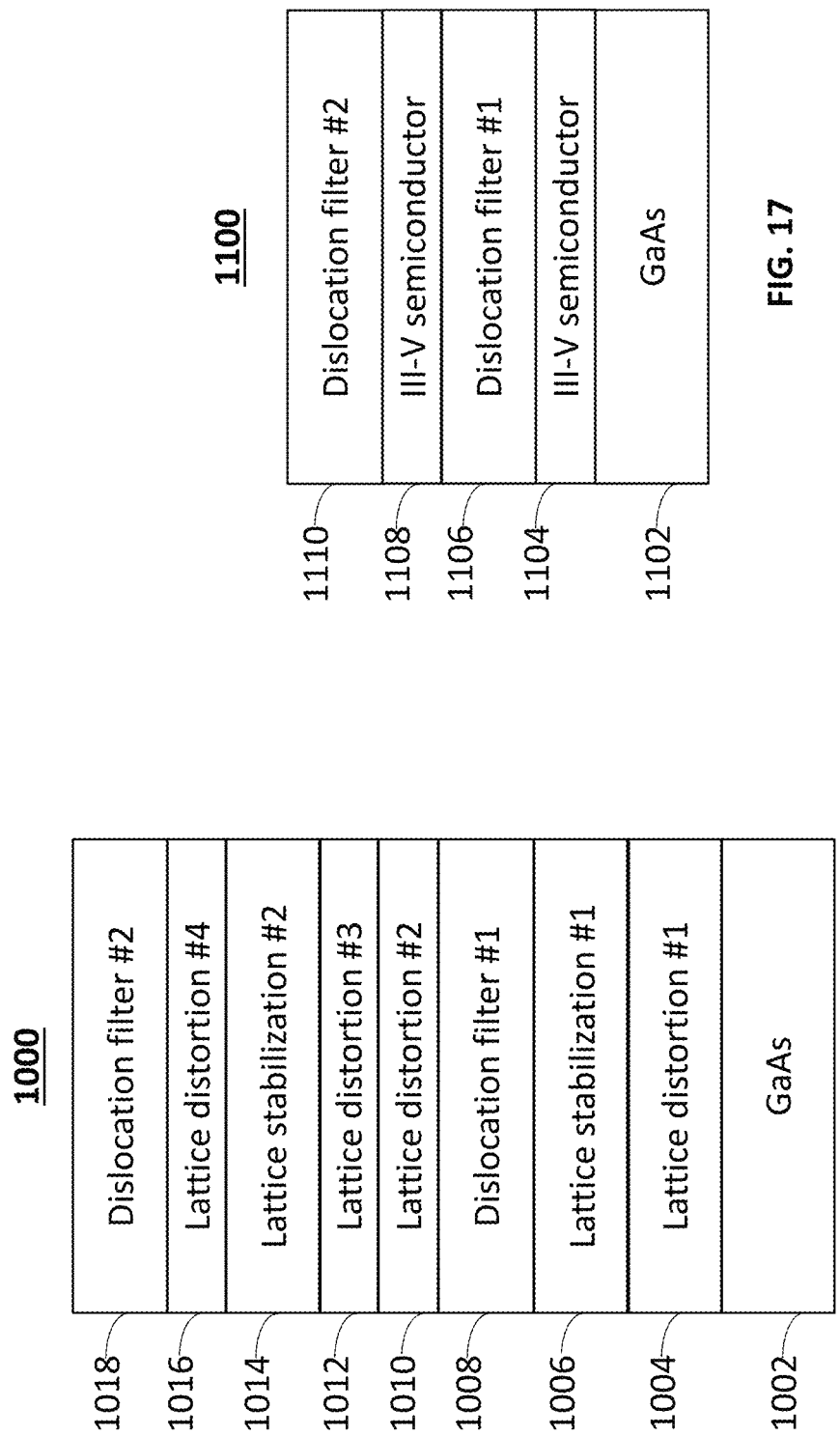

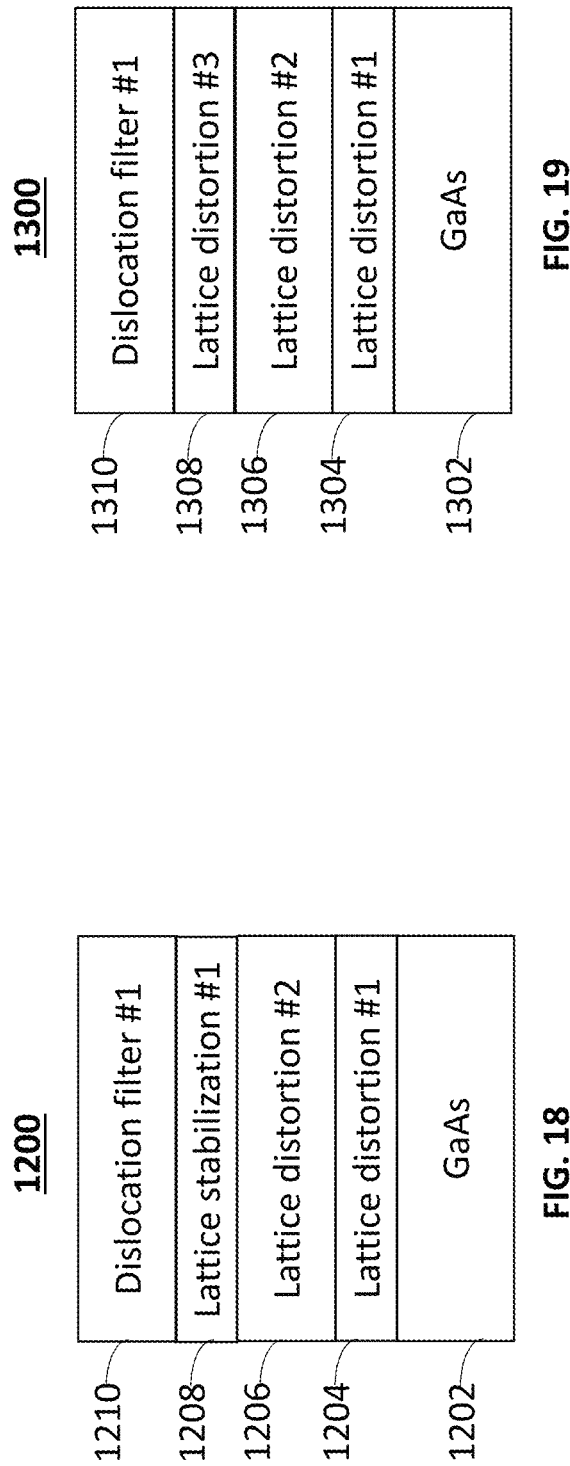

PNICTIDE NANOCOMPOSITE STRUCTURE FOR LATTICE STABILIZATION

CROSS-REFERENCE TO RELATED APPLICATIONS

This disclosure claims the benefit under 35 U.S.C. § 119(e) of U.S. Provisional Patent Application No. 62/806,378, filed Feb. 15, 2019, which is hereby incorporated by reference herein in its entirety.

BACKGROUND

In existing semiconductor structures, indium phosphide (InP) or other III-N based electronics and optoelectronics are usually grown over a silicon (Si) or gallium arsenide (GaAs) substrate, as these substrates are generally cost efficient. However, growing a III-N material on a silicon substrate has traditionally been difficult due in large part to the large crystal lattice mismatch between the substrates and indium phosphide (InP).

SUMMARY

Systems and methods described herein use pnictide nanocomposites to control lattice distortion in a series of Group III-V layers. The distortion is tuned to bridge lattice mismatch between binary III-V semiconductors.

Lattice distortion may be introduced into an intermediate layer of a semiconductor structure by inserting pockets of rare earth pnictide nanocomposites into the intermediate layer. The nanocomposites may include a different material from the materials that are part of the intermediate layer. Often, insertion of the nanocomposites in a single intermediate layer is insufficient to stabilize growth of InP over the substrates.

In view of these problems, a layered structure comprising a sequence of intermediate layers including nanocomposites is designed to bridge the lattice mismatch between a substrate and a III-V semiconductor. In some embodiments, the substrate may comprise GaAs or Si. In some embodiments, the substrate may be a binary III-V semiconductor. In some embodiments, the target III-V semiconductor to be grown on the substrate is InP.

In some embodiments, an intermediate layer of the layered structure may be a distortion layer, epitaxially grown over the substrate. The distortion layer may include pockets of rare earth pnictide nanocomposites to introduce lattice distortion. According to another embodiment, a layer may comprise a first alloy of Group III and Group V elements. In some embodiments, nanocomposites of a second alloy of Group III and Group V elements are introduced into a layer of the first alloy.

In some embodiments, pockets of nanocomposites include a material with a lattice constant that may be greater than the lattice constant of the distortion layer. In such embodiments, the pockets of nanocomposites may increase the lattice constant of the distortion layer at the location where they are inserted. Higher concentration of pockets of nanocomposites may lead to higher distortion in the lattice structure of the distortion layer.

In some embodiments, the distortion layer may include material similar to the material of the substrate. For example, a substrate may include a GaAs and the distortion layer may also include a InGaAs compound. In some embodiments, the distortion layer may include the same material as the substrate. For example, a substrate may include a GaAs and the distortion layer may also include GaAs.

In some embodiments, an intermediate layer of the layered structure may be a stabilization layer. The stabilization layer is epitaxially grown over the distortion layer. In some embodiments, the stabilization layer may have a lattice constant similar to the distorted lattice constant of the distortion layer. The stabilization layer may include III-V semiconductors. In some aspects, the stabilization layer may include a III-V alloy. The III-V alloy may include the following formula $In_xGa_yAl_zAs_nP_m$ alloy. In this formula, x is represented by $0 \leq x \leq 1$, y is represented by $0 \leq y \leq 1$, x is represented by $0 \leq z \leq 1$, n is represented by $0 \leq n \leq 1$ and m is represented by $0 \leq m \leq 1$.

In some embodiments, a second distortion layer may be epitaxially grown over the stabilization layer. The second distortion layer includes pockets of nanocomposites that may further distort the lattice structure.

In some embodiments, the distortion introduced in the layered structure may be controlled using a unit combining a stabilization layer epitaxially grown over a distortion layer. The unit may be referred to as a distortion unit. The unit may be inserted at any point in the layered structure to introduce distortion in the lattice constant.

In some embodiments, a stack formed by multiple repetitions of the unit may be used to introduce distortion and to create a buffer region between layers. The amount of distortion introduced by the stack may be tuned by changing the rare earth (RE) species in the stack.

In some embodiments, total lattice distortion in lattice distortion layer is built up through the thickness of the unit by using repetitive sub-layers of RE-V nanocomposites.

In some embodiments, some of these sub-layers may have pockets of nanocomposites to introduce distortion. The nanocomposite is not required to maintain a constant size, density, or distribution across the thickness of a distortion unit or across different sub-layers. The distribution, density or size of the nanocomposites may increase as more sub-layers are grown.

In some embodiments, the distortion of a distortion unit may be controlled in a direction perpendicular to the layered structure in part by the thickness of the barrier layer between adjacent nanocomposites, and subsequent interaction between adjacent nanocomposites. In some embodiments, an interaction region with more pockets of nanocomposites may produce a higher amount of distortion compared to an interaction region with fewer pockets of nanocomposites.

In some embodiments, the amount of distortion created in a distortion layer may be controlled by inserting different rare earth species of nanocomposites. For example, a single rare earth species may form RE-As or RE-P nanocomposites. In some embodiments, nanocomposites of a first species and a second species may be inserted into a distortion layer to introduce lattice distortion. For example, a plurality of rare earth species may form RE-As or RE-P nanocomposites.

In some embodiments, pockets of nanocomposites may be inserted into a unit which may result in lattice contraction of a distortion layer of the unit. In such embodiments, the unit may be referred to as a contraction unit. In some embodiments, a III-V semiconductor may be grown over a contraction unit.

In some embodiments, distortion produced by a contraction unit may reduce the lattice constant of a structure. In such embodiments, the contraction unit may introduce distortion in a direction opposite to the distortion produced by a distortion unit.

In some embodiments, lattice dislocation may arise in a distortion layer of a unit when the thickness of the distortion layer approaches or exceeds a critical thickness. In some embodiments, pockets of rare-earth nanocomposites may be used to filter out the dislocations. In such embodiments, the unit may be referred to as a dislocation filter. In some embodiments, the thickness of the dislocation filter approaches or exceeds a critical thickness for dislocation annihilation. In some embodiments, a III-V semiconductor may be grown over a dislocation filter.

In some embodiments, a layered structure may include a combination of distortion layers, stabilization layers, and/or dislocation layers. In such embodiments, the layered structure may include multiple repetitions of any combination of a stabilization layer, a distortion layer, and a dislocation filter over a substrate. The various layers may be ordered based on need of lattice stability. In some embodiments, the sequencing, number, specific lattice constant, and density or number of pockets of nanocomposites in the distortion layers may be varied to achieve a target lattice constant at the upper surface of a layered structure from the lattice constant of a substrate.

BRIEF DESCRIPTION OF DRAWINGS

Further features of the disclosure, its nature and various advantages will become apparent upon consideration of the following detailed description, taken in conjunction with the accompanying drawings, in which like reference characters refer to like parts throughout, and in which:

FIGS. 5-7 are various example diagrams of a layered structure illustrating distribution of the nanocomposites in the distortion layer: Distortion Type A, Distortion Type B, and Distortion Type C, according to an embodiment described herein;

FIG. 15 is an example diagram illustrating a dislocation filter created by the nanocomposites in the distortion layer, according to an embodiment described herein;

FIG. 16 shows an example layered structure including a combination of various distortion layers, stabilization layers and/or dislocation filters, according to an embodiment described herein;

FIG. 17 shows an example layered structure including a combination of various dislocation filters, according to an embodiment described herein;

FIGS. 18 and 19 show various examples of a layered structure including various distortion layers, according to an embodiment described herein;

DETAILED DESCRIPTION

Systems and methods described herein use pnictide nanocomposites to control lattice distortion in a series of Group III-V layers. The distortion is tuned to bridge lattice mismatch between binary III-V semiconductors.

In some existing semiconductor structures, such as those described in "Lattice distortion in a single crystal rare-earth arsenide/GaAs nanocomposite," by A. J. Young et al, APL v104, p073114, (2014)) lattice distortion is introduced into an intermediate layer using pockets of nanocomposites of III-V semiconductors. The nanocomposites may include a different material from the materials that are part of the intermediate layer. The elements that form the III-V material of the pockets of nanocomposites are selected based on the stability of the underlying structure and a desired distortion to be introduced in the layer. Nanocomposites of a second alloy are introduced within a layer of a first alloy. Introduction of nanocomposites of a second alloy in the layer of a first alloy creates a distortion in the layer where the nanocomposite is inserted. Insertion of multiple pockets of nanocomposites in a portion of the intermediate layer leads to a dilation of the material that includes the first layer. However, because the difference in the lattice constants corresponding to the substrate (GaAs) and the target layer (InP) can often be significant, the distortion introduced by inserting pockets of nanocomposites in a single intermediate layer is often insufficient to lend stability for the growth of InP over the substrates.

In view of these problems, a sequence of multiple intermediate layers such as pnictide nanocomposites, each having controlled distortion and lattice stabilization in the structure, are designed to bridge the lattice mismatch between two binary III-V semiconductors. In some embodiments, the substrate may be GaAs or Si, and the target III-V semiconductor to be grown on the substrate is InP.

Figure 1:
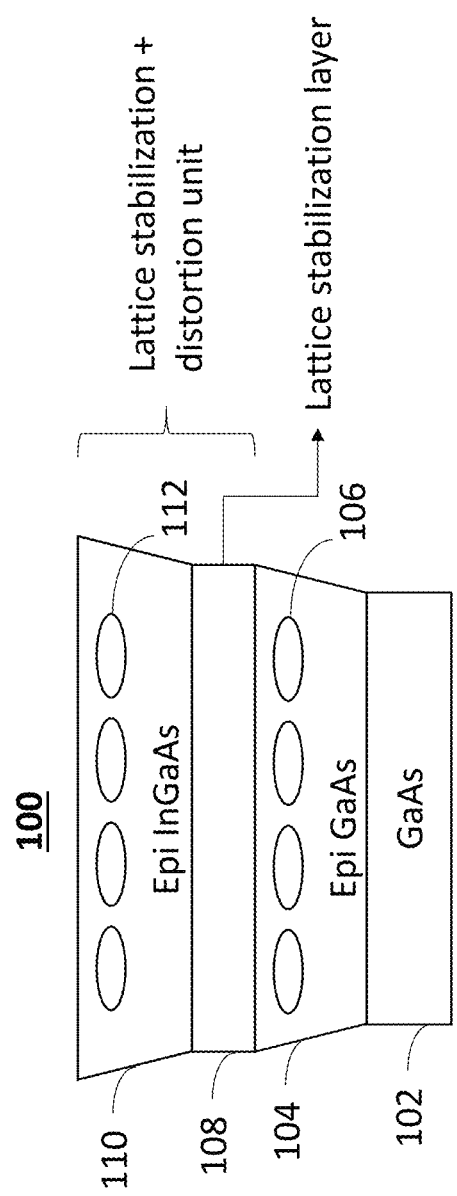
FIG. 1 shows an example of a layered structure that incorporates nanocomposites in a layer, according to an embodiment described herein.

FIG. 1 shows an example of a layered structure that incorporates nanocomposites in a layer, according to an embodiment described herein. Layered structure 100 may include a substrate 102. For example, the substrate 102 may be a GaAs layer. According to another example, the substrate 102 may be a silicon substrate, germanium, and/or other common substrate material. Distortion layer 104 is epitaxially grown over substrate 102. In some embodiments, distortion layer 104 may include the similar material as substrate 102. According to another aspect of this embodiment, distortion layer 104 may include the same material as substrate 102. For example, a GaAs substrate with a GaAs distortion layer epitaxially grown over the substrate. In some embodiments, the distortion layer 104 may include pockets of nanocomposites 106 to introduce distortion in distortion layer 104, by adding pockets of material that have lattice constant higher than the lattice constant of the distortion layer 104. For example, the pockets of nanocomposites 106 may include a material that has a lattice constant higher than the lattice constant of the distortion layer (e.g., bulk material of distortion layer 104 (GaAs)). In some embodiments, the pockets of nanocomposites include rare earth pnictides. In some embodiments, the pockets of nanocomposites 106 may increase the lattice constant of distortion layer 104 at the location where they are inserted. As described below with respect to FIG. 4, a higher concentration of pockets of nanocomposites 106 may lead to a higher distortion in the lattice structure of distortion layer 104. Additionally, the distortion can be varied based on the thickness of the layer in which the pockets are formed.

In some embodiments, the distortion layer 104 may include material similar to the material of substrate 102, e.g., both include GaAs. A lattice stabilization layer 108 may be a layer epitaxially grown over the distortion layer 104. In some embodiments, the lattice stabilization layer 108 may have a lattice constant similar to the distorted lattice constant of distortion layer 104 including the nanocomposites 106. For example, the distortion layer 104 with a lattice constant, and the pockets of nanocomposites 106 with a lattice constant, when combined form a distorted lattice constant of the distortion layer 104. A second distortion layer 110 may be a second lattice distortion layer epitaxially grown over lattice stabilization layer 108. The second distortion layer 110 may include pockets of nanocomposites 112 that may further distort the lattice structure of layered structure 100.

According to such a configuration, the aforementioned distortion of the lattice structure allows growth of a layer of InP, having a large lattice constant, over a substrate 102 of GaAs having a much lower lattice constant without too many intermediate layers in between. Specifically, the distortion is tuned to bridge lattice mismatch between binary III-V semiconductors and thereby reducing the number of intermediate layers between the binary III-V semiconductors, resulting in the more efficient and cost-effective layered structures.

Figure 2:
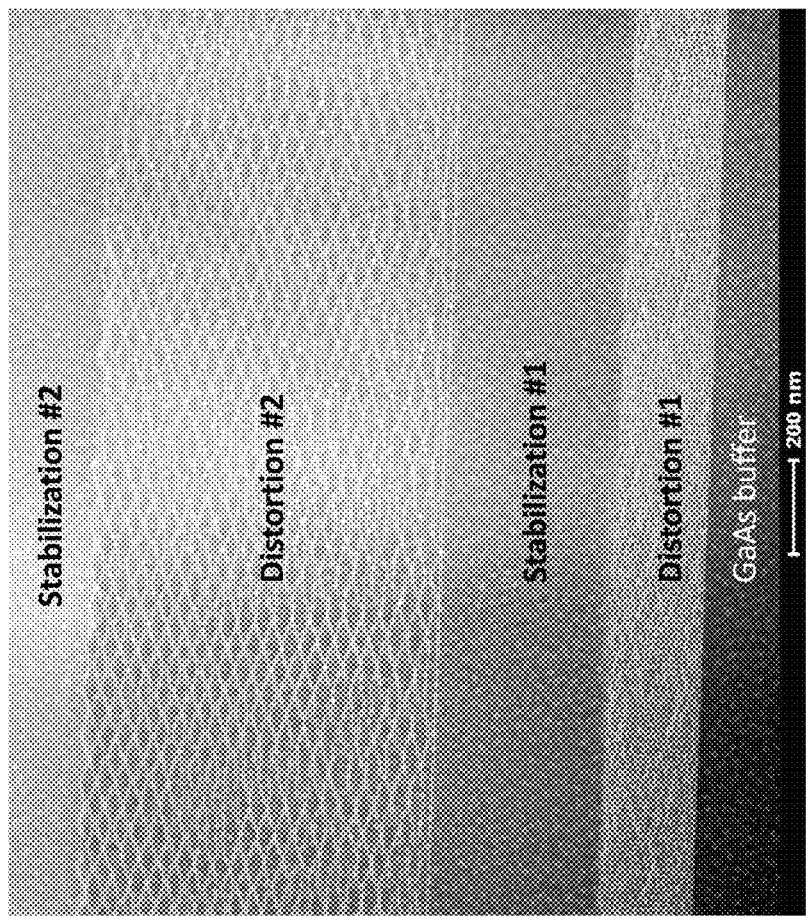
FIG. 2 shows a Transmission Electron Microscopy (TEM) image of a layered structure having various distortion layers formed over a substrate similar to the structure shown in FIG. 1, according to an embodiment described herein.

FIG. 2 shows a TEM image of a layered structure having various distortion layers formed over a substrate similar to the structure shown in FIG. 1, according to embodiments described herein. In the image shown in FIG. 2, a layered structure includes a GaAs substrate with a first distortion layer, a first stabilization layer, a second distortion layer and a second stabilization layer.

In some embodiments, the layered structure can include a first unit including a distortion layer and stabilization that incrementally bridge the lattice mismatch. Further, the structure can also include a second unit including a distortion layer and stabilization that incrementally bridges the lattice mismatch between binary III-V semiconductors. In some embodiments, the number of units may be tuned to most efficiently bridge the lattice mismatch. According to some examples, the distortion layers and stabilization layers may be stacked vertically.

Figure 3:
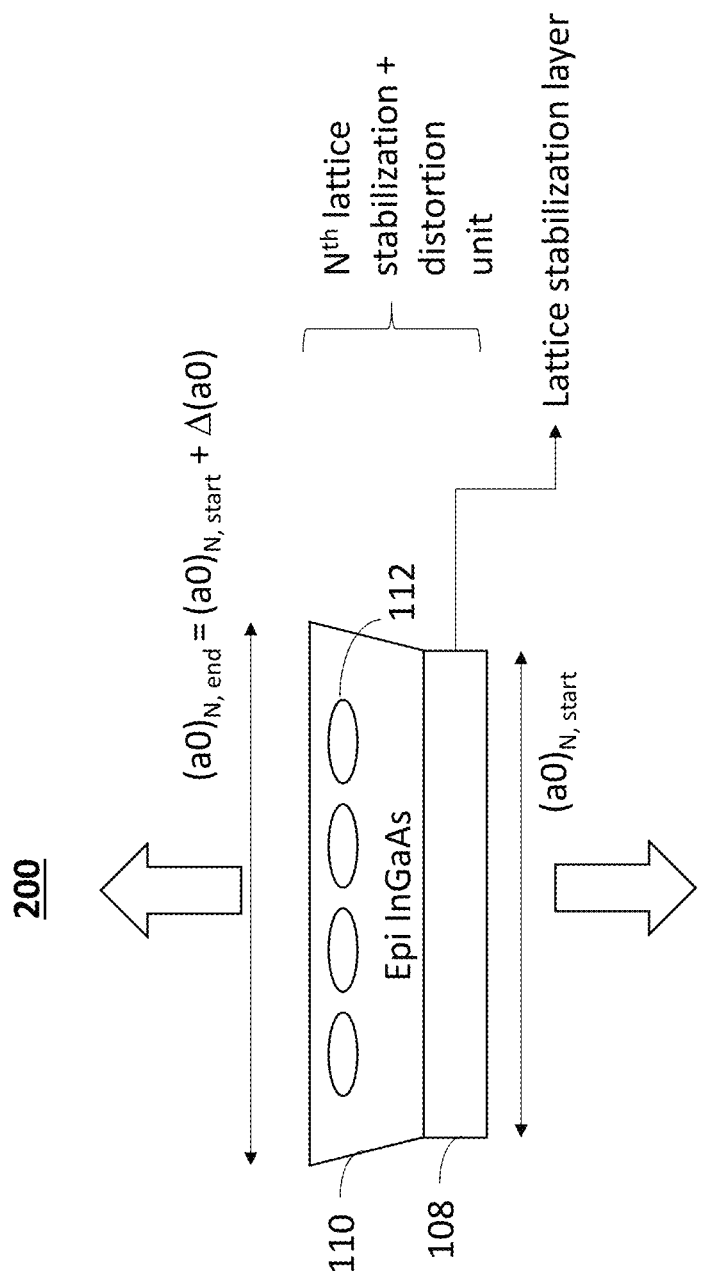
FIG. 3 shows an example of a layered structure illustrating aspects of controlling distortion, according to an embodiment described herein.

FIG. 3 is an example diagram illustrating aspects of controlling distortion introduced in a layered structure, according to an embodiment described herein. Layered structure 200 shows a unit of a combination of a lattice stabilization layer 108 and distortion layer 110, which may be inserted at any point in a layered structure to introduce distortion in the lattice constant of the layered structure.

In some embodiments, lattice stabilization layer 108 is a lattice stabilization layer as described in FIG. 1. For example, the lattice stabilization layer 108 may be grown over a previous distortion layer 104 to introduce stability in a layered structure. Distortion layer 110 is epitaxially grown over lattice stabilization layer 108. Distortion layer 110 includes pockets of nanocomposites 112 to introduce a distortion in distortion layer 110. The combination of layered structure 200 including lattice stabilization layer 108 and distortion layer 110 together may be inserted at any point in a layered structure to introduce distortion within the layered structure.

In some embodiments, a stack of multiple repetitions of the layered structure 200 may be used to introduce distortion and to create a buffer region between layers, e.g., between a GaAs layer and an InP layer. Distortion introduced by the stack of multiple repetitions of layered structure 200 may be changed by changing the rare earth species in the stack. For example, the rare earth species in the stack may be varied from any of the rare earths pnictide. For each unit (layered structure 200), a specific amount of distortion can be introduced. For example, if layered structure 200 represents the Nth combination of the lattice stabilization layer and distortion unit used in a layered structure, the lattice constant $(a0)_{N,start}$ at the bottom surface of the Nth unit (layered structure 200) plus the amount of distortion introduced by the Nth unit, $\Delta(a0)$, results in the lattice constant $(a0)_{N,end}$ at the upper surface of the Nth unit (layered structure 200). The amount of distortion $\Delta(a0)$ introduced by the combination of 108 and 110 may be controlled by the pockets of nanocomposites 112 in distortion layer 110.

Figure 4:
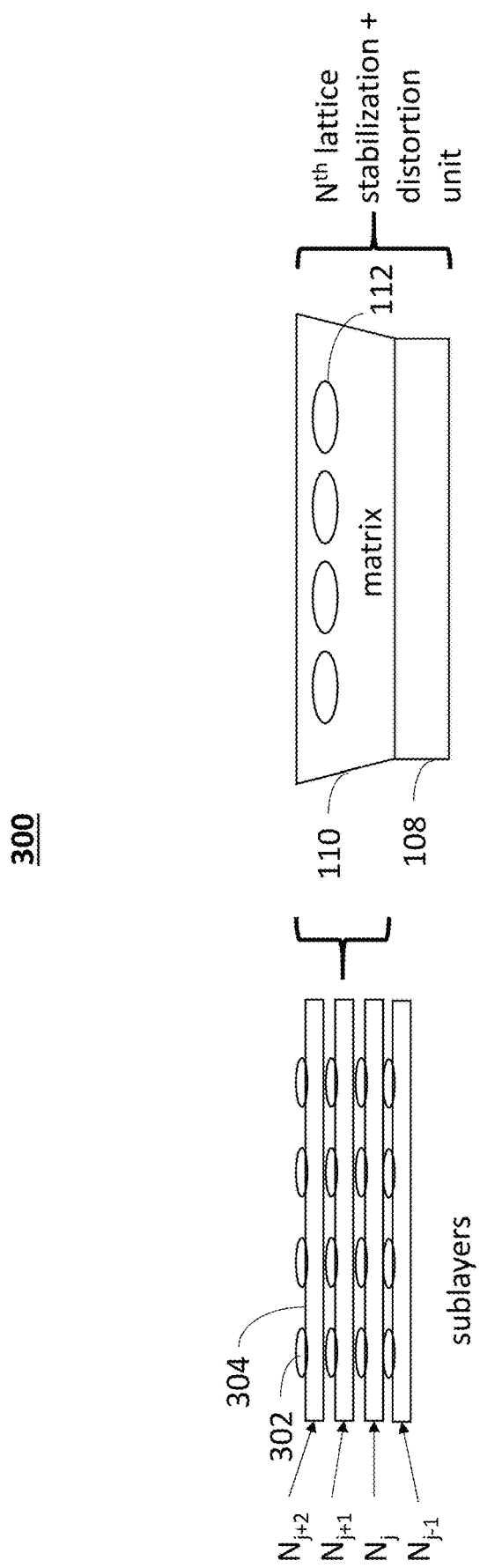
FIG. 4 shows an example of a layered structure that shows an example structure of the distortion unit, according to an embodiment described herein.

FIG. 4 is an example diagram 300 that shows an example structure of the distortion unit (110), according to an embodiment described herein. In some embodiments, total lattice distortion in distortion layer 110 is built up through the thickness of the unit by using repetitive sub-layers of rare earth-V nanocomposites.

As shown at 304, distortion layer 110 includes multiple sublayers, e.g., the Nth unit of combination of the lattice stabilization layer 108 and the distortion unit 110 includes sublayers shown at $N_{j-1}$, $N_j$, $N_{j+1}$, .... In some embodiments, some of these sub-layers may have pockets of nanocomposites 302 to introduce distortion. Thus, the total lattice distortion in the distortion layer 110 is built up through the total thickness of the unit by using repetitive sub-layers of rare earth-V nanocomposites. Across the thickness of the distortion unit 110, there is no requirement for the nanocomposite to maintain a constant size or density. The distribution, density or size of the nanocomposites 302 may be different across different sublayers $N_{j-1}$, $N_j$, $N_{j+1}$ ..., and may increase as the more sublayers are grown. In addition, the distortion in the distortion layer is adjusted by varying the thickness of the sublayers FIGS. 5-7 are various example diagrams illustrating distribution of the nanocomposites in the distortion layer, according to an embodiment described herein. In the example shown in FIG. 5, the distortion layer 400 includes sublayers having a thickness "c". As the thickness of the sublayer decreases, the distribution of the nanocomposites changes, which in turn controls the amount of distortion provide by each distortion layer. The distortion shown in FIG. 4 is a distortion type C, where the thickness of the sublayers permits the pockets to form in their own layer with minimal bleeding into the adjacent layers. In the distortion layer 500 shown in FIG. 6, distortion type B is shown and includes sublayers having a thickness "b". The sublayers having thickness "b" are thinner than the sublayers having the thickness "c" in the distortion type C. In the distortion type B, the sublayers are thinner and cause the pockets of nanocomposites with different distribution sublayers. In the distortion layer 600 shown in FIG. 7, a distortion type A is shown and includes sublayers having a thickness "a". The sublayers having thickness "a" are thinner and have different distribution sublayers that the sublayers having the thickness "b" and "c". In a direction that is perpendicular to the two-dimension view shown in FIG. 5, the distortion of the distortion unit can be controlled in part by the thickness of the barrier layer between adjacent nanocomposites, and the subsequent interaction between adjacent nanocomposites (e.g., rare earth pnictide nanocomposites). For example, as shown in FIG. 5, distortion layer 400 having an interaction region 406 includes two pockets of nanocomposites. As shown in FIG. 6, distortion layer 500, at which the nanocomposites are more densely distributed, e.g., with a thinner barrier layer between the nanocomposites, the interaction region 506 contains 3 nanocomposites 502. As shown in FIG. 7, distortion layer 600, at which the nanocomposites are even more densely distributed, e.g., with a thinner barrier layer between the nanocomposites, the interaction region 606 contains 4 nanocomposites 602.

In some embodiments, the interaction region 406 with more pockets of nanocomposites may be able to produce a higher amount of distortion as compared to interaction region 606. Accordingly, the distortion is tuned to bridge lattice mismatch between binary III-V semiconductors and thereby reducing the number of intermediate layers between the binary III-V semiconductors, resulting in the more efficient and cost-effective layered structures.

Figure 8:
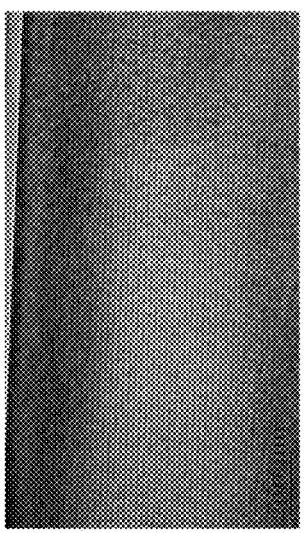
FIGS. 8-10 show TEM images of a layered structure having various distortion layers formed over a substrate, according to an embodiment described herein.

FIG. 8 shows a TEM image of a layered structure having a layer with a distortion type A formed over a substrate, according to embodiments described herein. In the image shown in FIG. 8, the layered structure includes distortion layer with pockets of nanocomposites more densely distributed, e.g., with a thinner barrier layer between pockets of nanocomposites thereby causing each of the pockets to overlap into the adjacent layer, resulting in a greater distortion.

Figure 9:
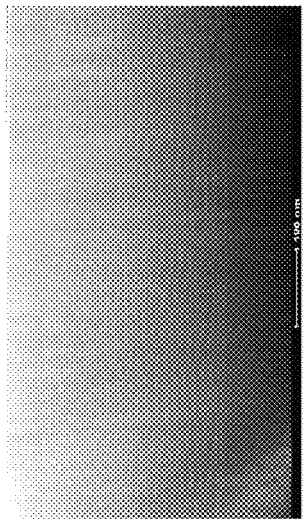

FIG. 9 shows a TEM image of a layered structure having a layer with a distortion type B formed over a substrate, according to embodiments described herein. In the image shown in FIG. 9, the layered structure includes distortion layer with pockets of nanocomposites less densely distributed, e.g., with a thicker barrier layer between pockets of nanocomposites thereby causing each of the pockets to overlap less frequently into the adjacent layer, resulting in a balanced distortion.

Figure 10:
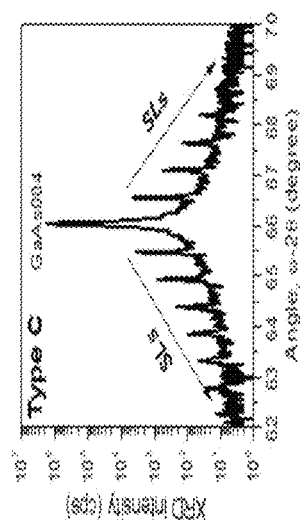

FIG. 10 shows a TEM image of a layered structure having a layer with a distortion type C formed over a substrate, according to embodiments described herein. In the image shown in FIG. 10, the layered structure includes distortion layer with pockets of nanocomposites even less densely distributed, e.g., with a thicker barrier layer between pockets of nanocomposites thereby causing each of the pockets to not overlap into the adjacent layer, resulting in a distortion that results in a smaller change in the lattice constant.

Figure 11:
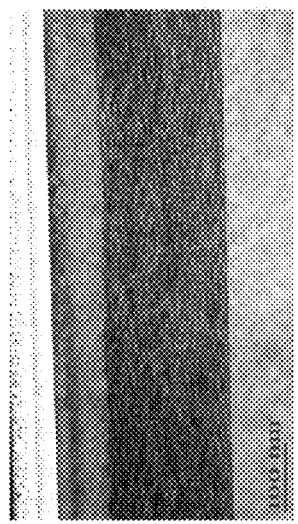
FIG. 11 is a diagram of intensity of diffracted X-rays for a Distortion Type A layer similar to the structure shown in FIG. 8, according to an embodiment described herein.
Figure 12:
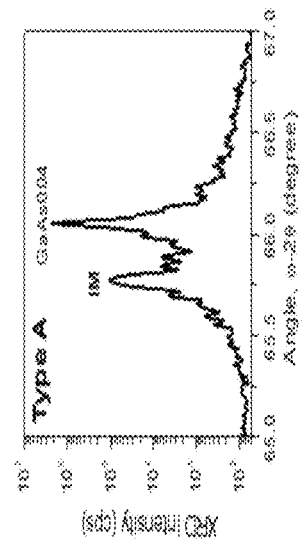
FIG. 12 is a diagram of intensity of diffracted X-rays for a Distortion Type C layer similar to the structure shown in FIG. 10, according to an embodiment described herein.

FIGS. 11 and 12 are diagrams of X-ray intensities for each of the distortion types, similar to the structure shown in FIGS. 8 and 10 respectively, according to embodiments described herein. In the diagram shown in FIG. 11, the intensity for the distortion resulting from intermixed (IM) layer having a distortion type A is illustrated. In the diagram shown in FIG. 12, the intensity for the distortion resulting from superlattices (SL) layer having a distortion type C is illustrated.

Figure 13:
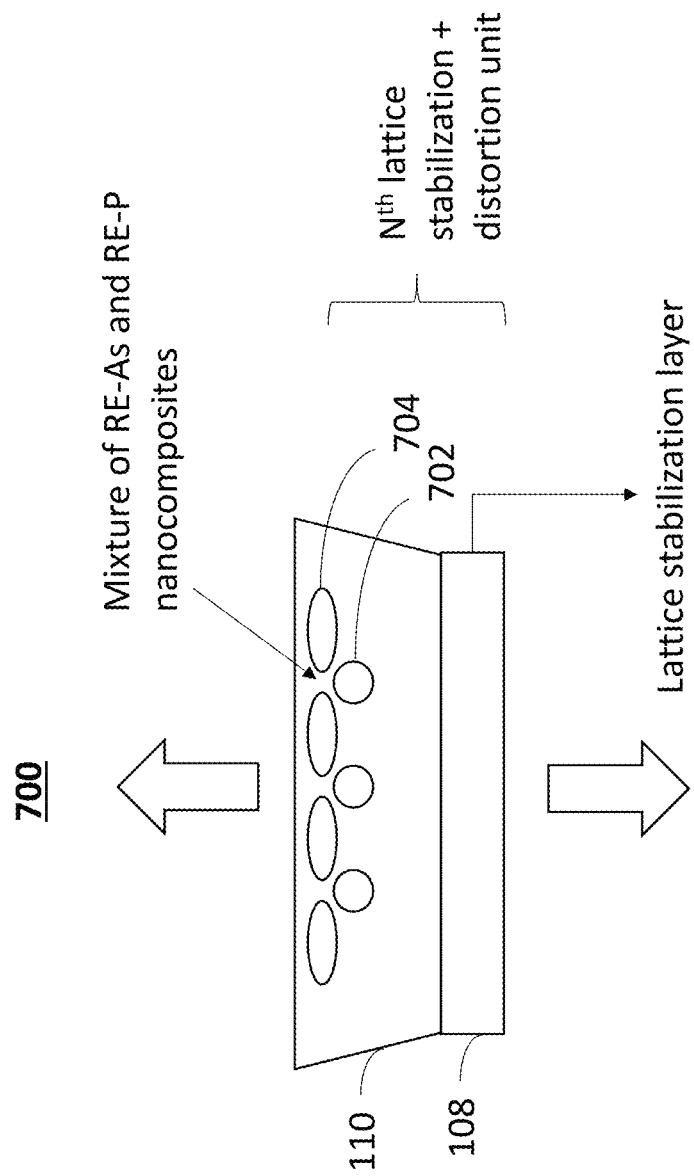
FIG. 13 is an example diagram that illustrates nanocomposites of different species in the distortion layer, according to an embodiment described herein.

FIG. 13 is an example of a layered structure 700 that illustrates nanocomposites of different species in the distortion layer 110, according to an embodiment described herein. In some embodiments, the amount of distortion created in distortion layer 110 may be controlled by inserting different species of nanocomposites. For example, group V species can be used—a single rare earth (RE) species may form either rare earth (RE-As) or rare earth (RE-P) nanocomposites. As shown in FIG. 7, nanocomposites of a first species 704 (e.g., RE-As) and a second species 702 (e.g., RE-P) are inserted in distortion layer 110 to introduce lattice distortion. In some embodiments, phosphorus (P) is introduced to produce the second species 702 (e.g., rare earth-P) in which there is no incorporation into the III-V alloy of the distortion layer 110.

Figure 14:
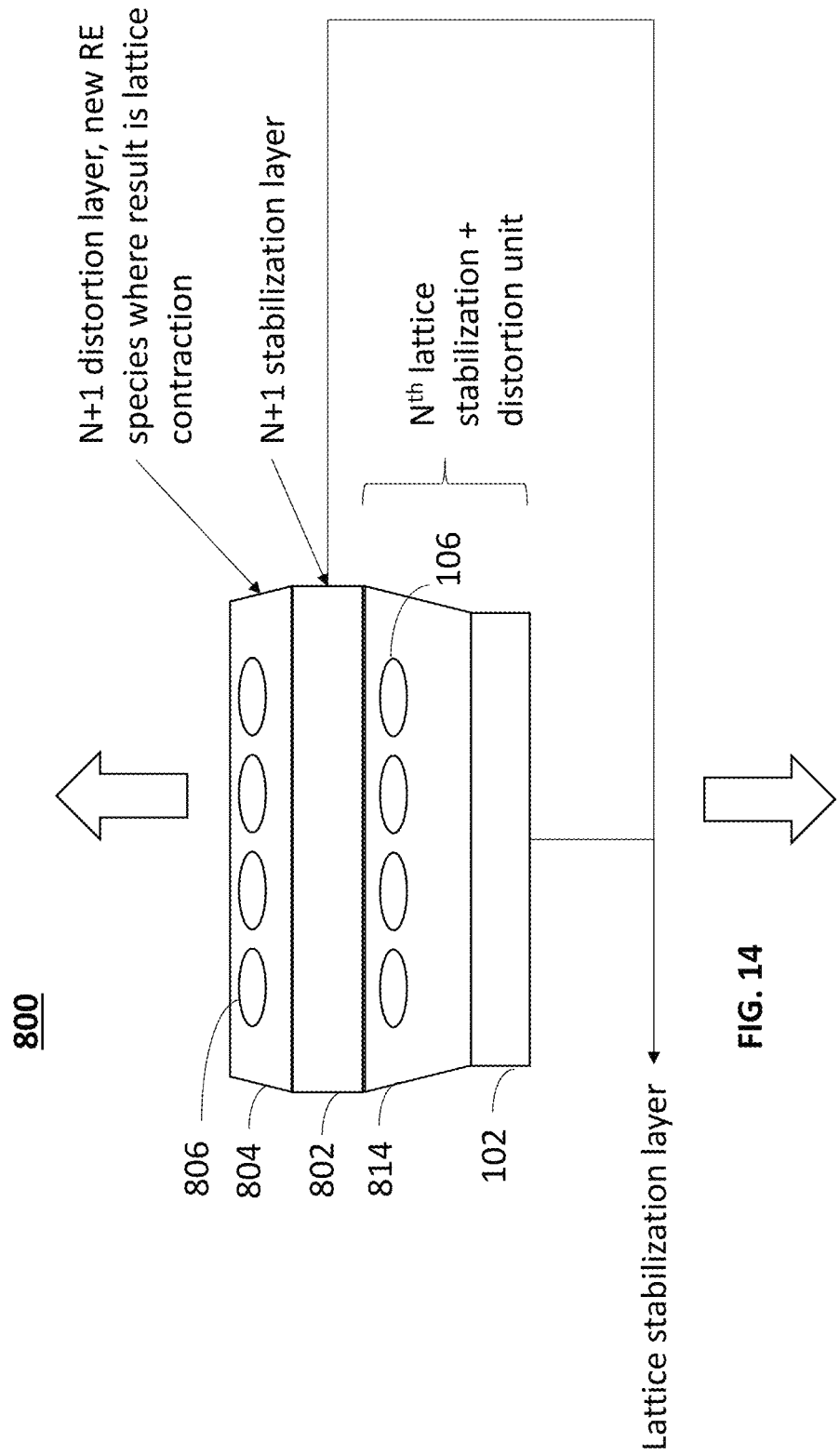
FIG. 14 is an example diagram illustrating aspects of the distortion produced by a stack of multiple combinations of the stabilization layer and the distortion layer, according to an embodiment described herein.

FIG. 14 is an example diagram illustrating aspects of the distortion produced by a stack of multiple combinations of the stabilization layer and the distortion layer, according to an embodiment described herein. Layered structure 800 of FIG. 14 depicts two stacked units N and N+1, each taking a structure similar to 200 in FIG. 3, e.g., a combination of a distortion layer and a lattice stabilization layer. Unit N includes distortion layer 814 and stabilization layer 812. Unit N+1 includes a distortion layer 804 and stabilization layer 802. Unit N+1 may be grown over unit N including distortion layer 814 and stabilization layer 812. For example, distortion layer 804, may include a different rare earth species than that used in the distortion layer 814, which may result in lattice contraction of the distortion layer 804, rendering the N+1 unit as a contraction unit. In some embodiments, a III-V semiconductor may be grown over a contraction unit. For example, III-V semiconductor may be grown over unit N+1 which is grown over unit N.

Pockets of nanocomposites 806 may be inserted in distortion layer 804 to distort lattice constant of the distortion layer. In some embodiments, the distortion produced in distortion layer 804 may reduce the lattice constant at the top of layered structure 800 by inserting pockets of nanocomposites 806 with a lower lattice constant than the lattice constant of distortion layer 804. As illustrated by the narrowing width of the distortion layer near the top of the structure. In such embodiments, the unit N+1 may introduce distortion in the unit N+1 in a direction opposite to the direction of the distortion produced in unit N.

FIG. 15 is an example diagram 900 illustrating a dislocation filter created by the nanocomposites in the distortion layer, according to an embodiment described herein. In the combination of the lattice stabilization layer 108 and distortion unit 110, lattice dislocations may arise in the distortion layer 110, based on the thickness of the distortion layer 110 (e.g., includes InGaAs). In some embodiments, pockets of rare-earth nanocomposites 902 may be used to filter out dislocations thereby improving crystal structure of subsequently grown layers.

FIG. 16 shows an example layered structure including a combination of various distortion layers, stabilization layers and/or dislocation layers, according to an embodiment described herein. The layered structure 1000 includes multiple repetitions of any combination of a stabilization layer, a distortion layer, and a dislocation filter (e.g., a distortion layer using RE nanocomposites pockets to filter dislocation) over a substrate 1002 (similar to 102 in FIG. 1). The order of the various layers may be different based on the need of lattice stability. For example, intermediate layers 1004, 1010, 1012, and 1016 are lattice distortion layers that may introduce distortion to increase or decrease the lattice constant of the layered structure 1000. Layers 1006 and 1014 are lattice stabilization layers that are grown over a respective distortion layer to stabilize the lattice constant introduced by the respective distortion layer. First dislocation filter 1008 and second dislocation filter 1018 are dislocation filters that may be used to remove dislocations introduced in layers based on the thickness of the layers. A III-V semiconductor (like InP), may be epitaxially grown over second dislocation filter 1018. The sequencing, number, specific lattice constant, and density or number of pockets of nanocomposites in the distortion layers may be varied to achieve a target lattice constant at the upper surface of second dislocation filter 1018 from the lattice constant of the substrate 1002. Accordingly, the distortion is tuned to bridge lattice mismatch between binary III-V semiconductors (e.g., GaAs and InP) and thereby reducing the number of intermediate layers between the binary III-V semiconductors, resulting in the more efficient and cost-effective layered structures.

FIG. 17 shows an example layered structure including a combination of various dislocation filters, according to an embodiment described herein. The layered structure 1100 includes a GaAs substrate with a first III-V semiconductor 1104 formed over the GaAs substrate. Further, a first dislocation filter 1106 (e.g., a distortion layer using RE nanocomposites pockets to filter dislocation) over the first III-V semiconductor 1104 and a second III-V semiconductor 1108 grown over the first dislocation filter 1106. The first III-V semiconductor can be the same or different as the second III-V semiconductor. Further, a second dislocation filter 1110 is grown over the second III-V semiconductors layer. Such a configurations is employed to block the dislocations that permeated from the substrate because of the lattice mismatch. Accordingly, the layered structure is able to be formed with fewer dislocations.

In some embodiments, the order of the various layers may be different based on the need of lattice stability and the need to block dislocation in the III-V semiconductor. For example, first dislocation filter 1106, and second dislocation filter 1110 may act as lattice distortion layers that may introduce distortion to increase or decrease the lattice constant of the layered structure 1100 and may further block dislocations from traveling up the layered structure. A III-V semiconductor (e.g., InP), may be epitaxially grown over first dislocation filter 1106. The sequencing, number, specific lattice constant, and density or number of pockets of nanocomposites in the distortion layers may be varied to achieve a target lattice constant at the upper surface of second dislocation filter 1110 from the lattice constant of the substrate 1102.

Figure 20:
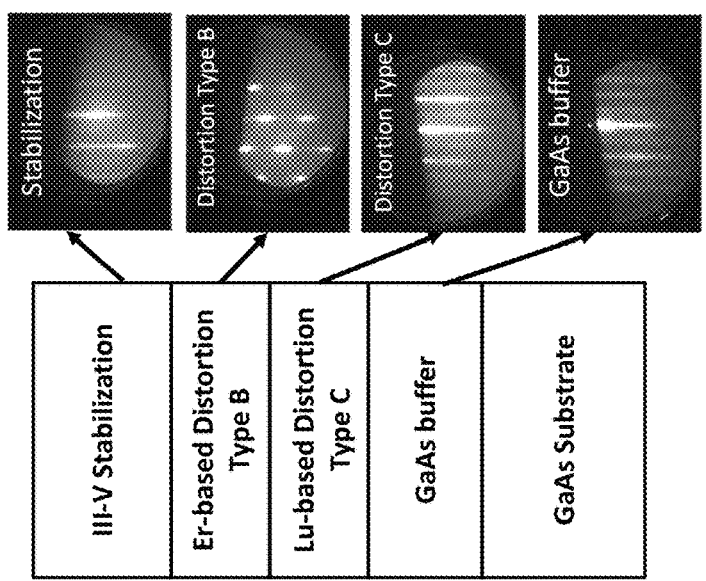
FIG. 20 shows an example of a layered structure and Reflection High-Energy Electron Diffraction (RHEED) image having a combination of various distortion layers, stabilization layers similar to the structure shown in FIG. 16, according to an embodiment described herein.

FIGS. 18-20 show various examples of a layered structure including different combinations of distortion layers, according to an embodiment described herein. In the example shown in FIG. 18, the layered structure 1200 includes a first distortion layer 1204, a second distortion layer 1206 grown over the first distortion layer 1204, a stabilization layer 1208 grown over the second distortion layer 1206 and a dislocation filter 1210 grown over the stabilization layer. The first distortion layer 1204 may include pockets of nanocomposites that may increase the lattice constant of the distortion layer at the location where they are inserted. Higher concentration of pockets of nanocomposites may lead to higher distortion in the lattice structure of the distortion layer and second distortion layer 1206 may include a similar RE-pnictide nanocomposite or a difference RE-pnictide nanocomposite. The second distortion layer 1206 may include a higher concentration of pockets of nanocomposites and may lead to higher distortion in the lattice structure of the distortion layer. The first and second distortion layers may form a variety of distortion layers. For example, the configuration described in distortion layer 400 (FIG. 5), distortion layer 500 (FIG. 6) and distortion layer 600 (FIG. 7). The distortion is tuned to bridge lattice mismatch between binary III-V by employing distortion layers in adjacent to each other.

In the example shown in FIG. 19, the layered structure 1300 includes a first distortion layer 1304, a second distortion layer 1306 grown over the first distortion layer 1304, a third distortion layer 1308 grown over the second distortion layer 1306 and a dislocation filter 1310 grown over the stabilization layer. Each of the first, second and third distortion layers may include pockets of nanocomposites that may increase the lattice constant of the distortion layer at the location where they are inserted. The first, second and third distortion layers may form a variety of distortion layers. For example, the configuration described in distortion layer 400 (FIG. 5), distortion layer 500 (FIG. 6) and distortion layer 600 (FIG. 7). The distortion is tuned to bridge lattice mismatch between binary III-V semiconductors by employing distortion layers in adjacent to each other.

For example, any combination of distortion layers stabilization layers and dislocation filters may be used in a layered structure trying to bridge lattice mismatch between binary III-V semiconductors, in accordance with the embodiment described herein. In some examples, the distortion layer of FIG. 5 may be used in combination with the distortion layer of FIG. 6. According to such a configuration, the layered structure includes two distortion layers. In another example, the distortion layer of FIG. 5 may be used in combination with the distortion layer of FIG. 7 and the dislocation filter of FIG. 15. According to such a configuration, the layered structure includes two distortion layers and a dislocation filter to block dislocations from growing through the structure.

Figure 21:
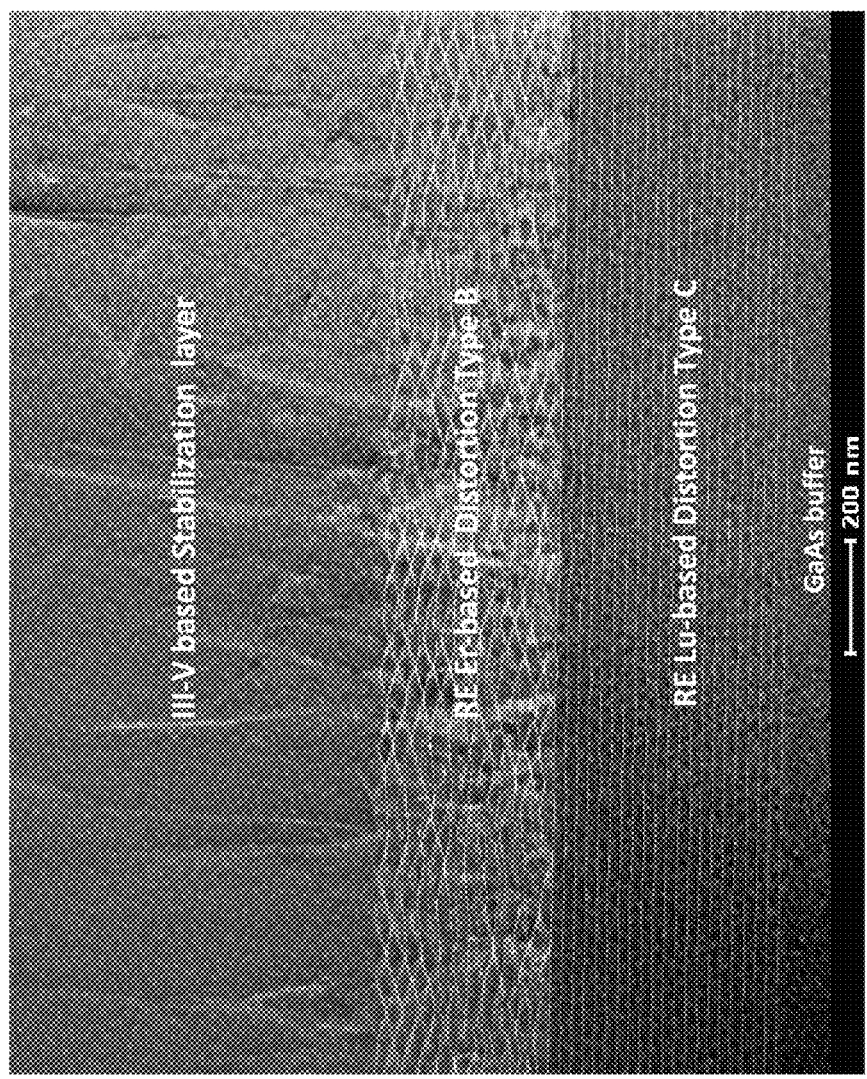
FIG. 21 shows a TEM image of a layered structure having various distortion layers formed over a substrate similar to the structure shown in FIG. 16, according to an embodiment described herein.

FIGS. 20 and 21 show an example of a layered structure including one configuration of the distortion layers, according to an embodiment described herein. In the example shown in FIG. 20 the layered structure includes a GaAs substrate with a GaAs buffer layer over the substrate layer, a first distortion layer (e.g., Lutetium (Lu)), a second distortion layer (e.g., Erbium (Er)), grown over the first distortion layer, and a III-V stabilization layer grown over the second distortion layers. According to such a configuration, the distortion is tuned to bridge lattice mismatch between binary III-V semiconductors.

The image in FIG. 21 (TEM) shows the layered structure similar to the structure shown in FIG. 20 with the first distortion layer having a distortion type C and the second distortion having a distortion type B.

Figure 22:
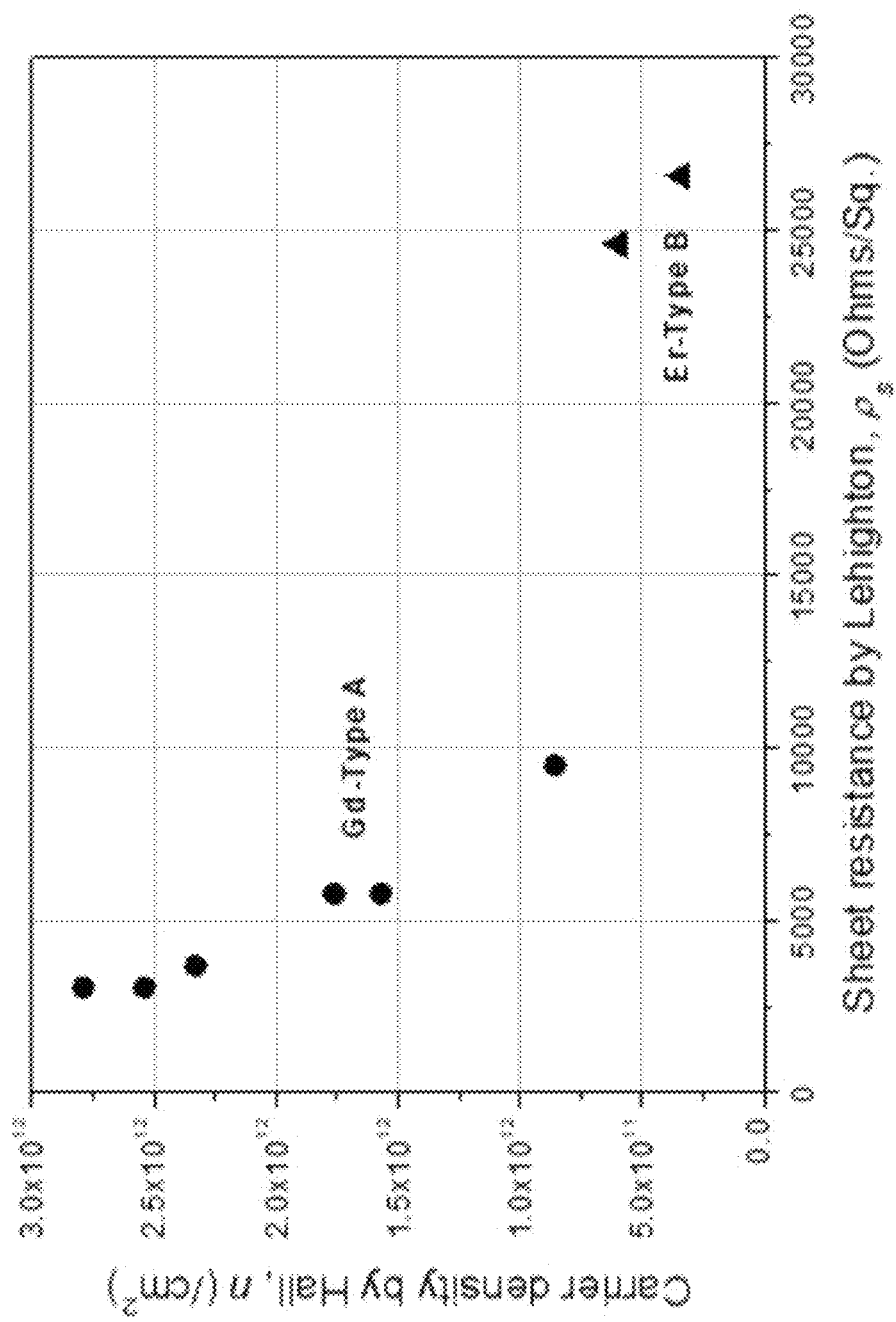
FIG. 22 is a diagram of sheet resistivity of a layered structure having various distortion layers, according to an embodiment described herein.

FIG. 22 shows a diagram of sheet resistivity of a layered structure having various distortion layers, according to an embodiment described herein. In the diagram shown in FIG. 22, the sheet resistivity for the variety of distorted layers is shown. Specifically, electric behavior of the layer stack may be determined by the choice of nanocomposite and/or distortion design.

Figure 23:
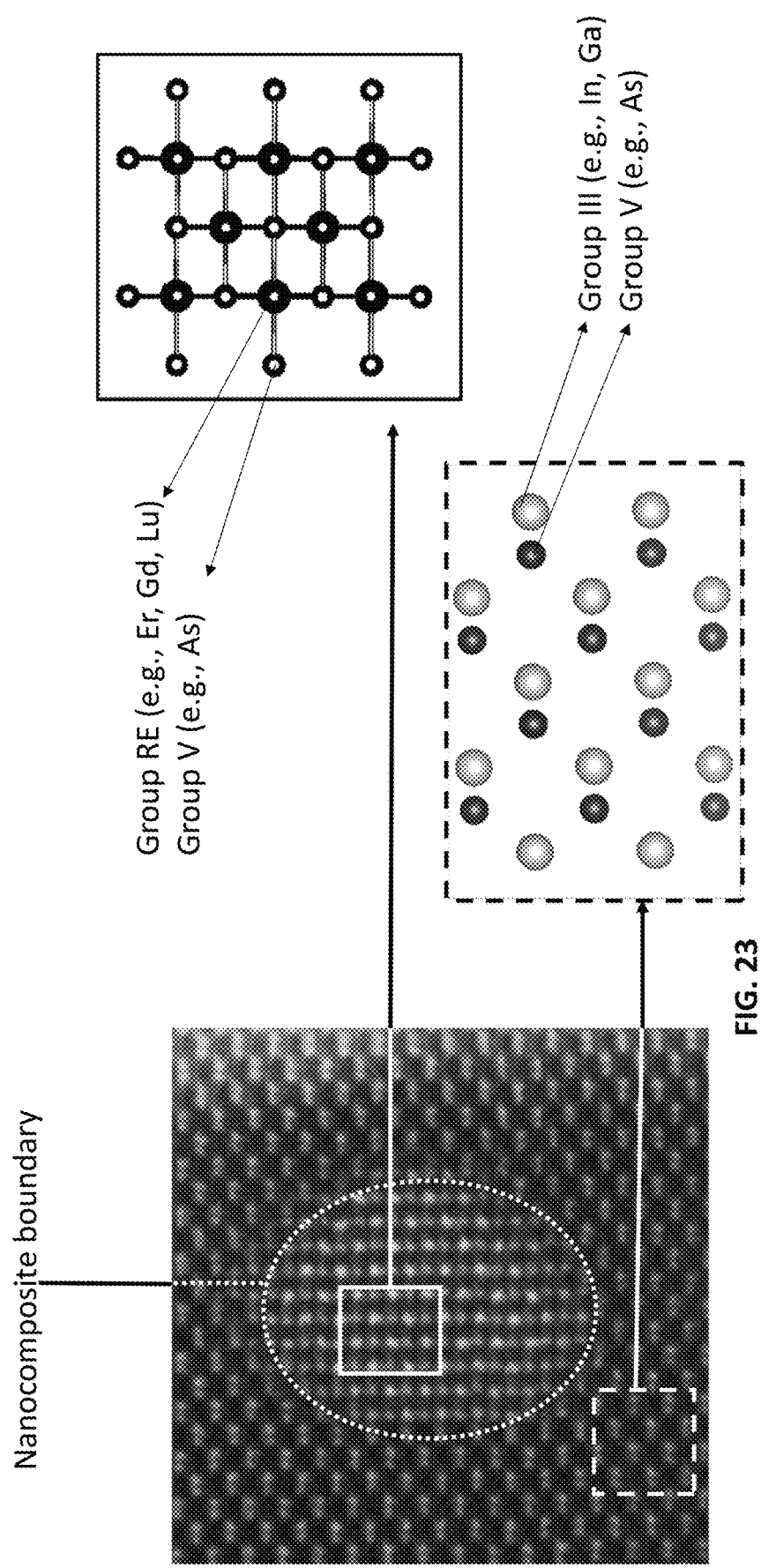
FIG. 23 shows an example of a layered structure with a localized lattice distortion as compared to the bulk layer, according to an embodiment described herein.

FIG. 23 shows an example of an individual nanocomposite with a different lattice construction to the surrounding crystal lattice. At the boundary of the individual nanocomposite as shown are 2 different lattice constant allowing for the distortion required to change the overall crystal lattice spacing or filter dislocation as described herein. In the pocket, the rare earth may be any selected type of rare earth. In some embodiments, the rare earth is selected from a group consisting of Er, Gd and Lu. An example of the group V element is As.

As described herein, a layer means a substantially-uniform thickness of a material covering a surface. A layer can be either continuous or discontinuous (i.e., having gaps between regions of the material). For example, a layer can completely or partially cover a surface, or be segmented into discrete regions, which collectively define the layer (i.e., regions formed using selective-area epitaxy).

Monolithically-integrated means formed on the surface of the substrate, typically by depositing layers disposed on the surface.

Disposed on means "exists on" an underlying material or layer. This layer may comprise intermediate layers, such as transitional layers, necessary to ensure a suitable surface. For example, if a material is described to be "disposed on a substrate," this can mean either (1) the material is in intimate contact with the substrate; or (2) the material is in contact with one or more transitional layers that reside on the substrate.

Single-crystal means a crystalline structure that comprises substantially only one type of unit-cell. A single-crystal layer, however, may exhibit some crystalline defects such as stacking faults, dislocations, or other commonly occurring crystalline defects.

Single-domain means a crystalline structure that comprises substantially only one structure of unit-cell and substantially only one orientation of that unit cell. In other words, a single-domain crystal exhibits no twinning or anti-phase domains.

Single-phase means a crystalline structure that is both single-crystal and single-domain.

Substrate means the material on which deposited layers are formed. Exemplary substrates include, without limitation: bulk silicon wafers, in which a wafer comprises a homogeneous thickness of single-crystal silicon; composite wafers, such as a silicon-on-insulator wafer that comprises a layer of silicon that is disposed on a layer of silicon dioxide that is disposed on a bulk silicon handle wafer; or any other material that serves as base layer upon which, or in which, devices are formed. Examples of such other materials that are suitable, as a function of the application, for use as substrate layers and bulk substrates include, without limitation, germanium, alumina, gallium-arsenide, indium-phosphide, silica, silicon dioxide, borosilicate glass, pyrex, and sapphire. A substrate may have a single bulk wafer, or multiple sub-layers. Specifically, a substrate may include multiple non-continuous porous portions. The multiple non-continuous porous portions may have different densities and may be horizontally distributed or vertically layered.

Miscut Substrate means a substrate which comprises a surface crystal structure that is oriented at an angle to that associated with the crystal structure of the substrate. For example, a 6° miscut <100> silicon wafer comprises a <100> silicon wafer that has been cut at an angle to the <100> crystal orientation by 6° toward another major crystalline orientation, such as <110>. Typically, but not necessarily, the miscut will be up to about 20°. Unless specifically noted, the phrase "miscut substrate" includes miscut wafers having any major crystal orientation. That is, a <111> wafer miscut toward the <011> direction, a <100> wafer miscut toward the <110> direction, and a <011> wafer miscut toward the <001> direction.

Rare earth elements include scandium, yttrium, lanthanum, cerium, praseodymium, neodymium, promethium, samarium, europium, gadolinium, terbium, dysprosium, holmium, erbium, thulium, ytterbium, lutetium or thorium. In some embodiments, the rare earth metal is scandium, yttrium, lanthanum, cerium, praseodymium, neodymium, promethium, samarium, europium, gadolinium, terbium, dysprosium, holmium, erbium, thulium, ytterbium or lutetium.

Semiconductor refers to any solid substance that has a conductivity between that of an insulator and that of most metals. An example semiconductor layer comprises silicon. The semiconductor layer may include a single bulk wafer, or multiple sub-layers. Specifically, a silicon semiconductor layer may include multiple non-continuous porous portions. The multiple non-continuous porous portions may have different densities and may be horizontally distributed or vertically layered.

Semiconductor-on-Insulator means a composition that comprises a single-crystal semiconductor layer, a single-phase dielectric layer, and a substrate, wherein the dielectric layer is interposed between the semiconductor layer and the substrate. This structure is reminiscent of prior-art silicon-on-insulator ("SOI") compositions, which typically include a single-crystal silicon substrate, a non-single-phase dielectric layer (e.g., amorphous silicon dioxide, etc.) and a single-crystal silicon semiconductor layer.

Semiconductor-on-insulator compositions include a dielectric layer that has a single-phase morphology, whereas SOI wafers do not. In fact, the insulator layer of typical SOI wafers is not even single crystal.

Semiconductor-on-insulator compositions include a silicon, germanium, or silicon-germanium "active" layer, whereas prior-art SOI wafers use a silicon active layer. In other words, exemplary semiconductor-on-insulator compositions include, without limitation: silicon-on-insulator, germanium-on-insulator, and silicon-germanium-on-insulator.

A first layer described and/or depicted herein as "configured on," "on" or "over" a second layer can be immediately adjacent to the second layer, or one or more intervening layers can be between the first and second layers. A first layer that is described and/or depicted herein as "directly on" or "directly over" a second layer or a substrate is immediately adjacent to the second layer or substrate with no intervening layer present, other than possibly an intervening alloy layer that may form due to mixing of the first layer with the second layer or substrate. In addition, a first layer that is described and/or depicted herein as being "on," "over," "directly on," or "directly over" a second layer or substrate may cover the entire second layer or substrate, or a portion of the second layer or substrate.

A substrate is placed on a substrate holder during layer growth, and so a top surface or an upper surface is the surface of the substrate or layer furthest from the substrate holder, while a bottom surface or a lower surface is the surface of the substrate or layer nearest to the substrate holder. Any of the structures depicted and described herein can be part of larger structures with additional layers above and/or below those depicted. For clarity, the figures herein can omit these additional layers, although these additional layers can be part of the structures disclosed. In addition, the structures depicted can be repeated in units, even if this repetition is not depicted in the figures.

From the above description it is manifest that various techniques may be used for implementing the concepts described herein without departing from the scope of the disclosure. The described embodiments are to be considered in all respects as illustrative and not restrictive. It should also be understood that the techniques and structures described herein are not limited to the examples described herein but can be implemented in other examples without departing from the scope of the disclosure. Similarly, while operations are depicted in the drawings in a particular order, this should not be understood as requiring that such operations be performed in the particular order shown or in sequential order, or that all illustrated operations be performed, to achieve desirable results.

What is claimed is:

1. A layered structure comprising:
   a substrate;
   a distortion layer having a first lattice constant and being epitaxially grown over the substrate, wherein the distortion layer comprises a plurality of nanocomposites that modify the first lattice constant of the distortion layer; and
   a stabilization layer having a second lattice constant and being epitaxially grown over the distortion layer, wherein a second lattice constant of the stabilization layer is lattice matched to the first lattice constant modified by the plurality of nanocomposites of the distortion layer,
   wherein the plurality of nanocomposites comprises a first species of nanocomposites and a second species of nanocomposites different from the first species of nanocomposites.

2. The layered structure of claim 1, wherein:
   the plurality of nanocomposites form a plurality of pockets in the distortion layer, and
   each pocket of the plurality of pockets modify the first lattice constant in a respective local region of the distortion layer.

3. The layered structure of claim 1, wherein the plurality of nanocomposites comprises RE pnictide.

4. The layered structure of claim 1, wherein the stabilization layer has a homogenous crystal structure.

5. The layered structure of claim 1, wherein the stabilization layer comprises III-V semiconductors.

6. The layered structure of claim 5, wherein the III-V semiconductors in the stabilization layer comprise a III-V alloy.

7. The layered structure of claim 6, wherein the III-V alloy is a $In_xGa_yAl_zAs_nP_m$ alloy.

8. The layered structure of claim 1, further comprising a semiconductor layer epitaxially grown over the stabilization layer.

9. The layered structure of claim 8, wherein the semiconductor layer comprises a Group III element and a Group V element.

10. The layered structure of claim 1, wherein the substrate comprises GaAs.

11. The layered structure of claim 1, wherein the distortion layer comprises a shared element with the substrate.

12. The layered structure of claim 1, wherein the distortion layer and the stabilization layer form a unit.

13. The layered structure of claim 12, further comprising a stack, wherein the stack comprises up to 40 units of the distortion layer and the stabilization layer.

14. The layered structure of claim 13, wherein the stack comprises nanocomposites of varying elements, sizes, and densities.

15. The layered structure of claim 1, wherein the distortion layer comprises Group III elements and a Group V element.

16. The layered structure of claim 1, further comprising a dislocation filter over the stabilization layer.

17. The layered structure of claim 1, wherein the distortion layer has a sheet resistivity of greater than 25,000 ohm-cm.

18. A layered structure comprising:
   a substrate;
   a first semiconductor layer epitaxially grown over the substrate;
   a dislocation filter epitaxially grown over the first semiconductor layer; and
   a second semiconductor layer epitaxially grown over the dislocation filter,
   wherein the dislocation filter comprises a plurality of nanocomposites, and
   wherein the plurality of nanocomposites comprises a first species of nanocomposites and a second species of nanocomposites different from the first species of nanocomposites.

* * * * *